US006411507B1

(12) United States Patent
Akram

(10) Patent No.: US 6,411,507 B1
(45) Date of Patent: *Jun. 25, 2002

(54) REMOVING HEAT FROM INTEGRATED CIRCUIT DEVICES MOUNTED ON A SUPPORT STRUCTURE

(75) Inventor: Salman Akram, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 174 days.

(21) Appl. No.: 09/221,537

(22) Filed: Dec. 28, 1998

Related U.S. Application Data

(62) Division of application No. 09/023,315, filed on Feb. 13, 1998.

(51) Int. Cl.[7] .................................................. H05K 7/20
(52) U.S. Cl. ...................... 361/690; 165/80.2; 165/185; 257/707; 257/713; 361/704; 361/719; 361/720
(58) Field of Search ................................. 165/80.2, 80.3, 165/185; 174/16.3; 257/706–707, 710, 712–713, 722; 361/704–705, 707–711, 715–720, 722

(56) References Cited

U.S. PATENT DOCUMENTS

| | | | | |
|---|---|---|---|---|
| 4,744,007 A | * | 5/1988 | Watari et al. | 361/704 |
| 5,014,161 A | * | 5/1991 | Lee et al. | 361/704 |
| 5,065,280 A | * | 11/1991 | Karnezos et al. | 361/715 |
| 5,307,236 A | * | 4/1994 | Rio et al. | 361/720 |
| 5,311,402 A | * | 5/1994 | Kobayashi et al. | 361/707 |
| 5,455,457 A | * | 10/1995 | Kurokawa | 361/697 |
| 5,510,956 A | * | 4/1996 | Suzutti | 361/704 |
| 5,587,882 A | * | 12/1996 | Patel | 361/705 |
| 5,623,394 A | * | 4/1997 | Sherif et al. | 361/705 |
| 6,082,443 A | * | 7/2000 | Yamamoto et al. | 361/704 |

OTHER PUBLICATIONS

Krumm "Chip Cooling" IBM Tech. Discl. Bulletin, vol. 20, No. 7, 12/77, pp. 2728–2729, 361/715.*

IBM TDB vol. 33, No. 1B, "Panel Heat Sink for VLSI Moduler". 257/719, Jun. 1990.*

IBM TDB, vol. 23, No. 11, Beaulieu "Module Thermal Clip". 257/719, Apr. 1981.*

* cited by examiner

Primary Examiner—Gregory Thompson
(74) Attorney, Agent, or Firm—Trop, Pruner & Hu, P.C.

(57) ABSTRACT

A cover, acting as a heat sink for integrated circuit devices, encloses one or more devices mounted on a support structure. The thermally conductive cover is formed of a thermally conductive material and is also sealed to the support structure. By thermally contacting the cover to the integrated circuit devices, heat is dissipated from the integrated circuit devices. A thermally conductive paste can be applied between the cover and integrated circuit devices to facilitate heat transfer from the integrated circuit devices to the cover.

6 Claims, 3 Drawing Sheets

REMOVING HEAT FROM INTEGRATED CIRCUIT DEVICES MOUNTED ON A SUPPORT STRUCTURE

This is a divisional of prior application Ser. No. 09/023,315 filed Feb. 13, 1998.

BACKGROUND

The invention relates to removing heat from integrated circuit devices mounted on a support structure.

Integrated circuit devices, such as microprocessors, DRAMs, and ASICs may contain millions of transistors. These integrated circuit devices, which may be bare dies mounted directly on a support structure (e.g., printed wiring boards or ceramic boards) or encapsulated in plastic packages, generate large amounts of heat during operation. Heat increases a device's electrical resistance which slows down the device and may affect the device's overall performance. Heat also accelerates wear and tear on the device and may reduce a device's overall life expectancy. Metal can also cause corrosion of metal liners used in the integrated circuit. Therefore, it is desirable to remove heat from integrated circuit devices and generally keep them as cool as possible during operation.

Integrated circuit devices are also very moisture sensitive. Extended exposure to humidity from the air may allow moisture to seep into the devices and damage them. For example, moisture seeping underneath the protective overcoat (PO) of an integrated circuit device will cause the PO to delaminate. Therefore, it is desirable to encapsulate integrated circuit devices in hermetically sealed packages to protect them from moisture. The packages also protect integrated circuit devices from damage due to physical stress during assembly and testing.

SUMMARY

In general, in one aspect the invention relates to a method for removing heat from an integrated circuit device mounted on a support including mounting a thermally conductive cover with a thermally conductive heat dissipating fin structure on the support over the integrated circuit device. The cover is positioned over the integrated circuit device in heat conductive communication with the integrated circuit device. A thermally conductive layer is applied between the cover and the integrated circuit device. The cover is attached to the support to provide a hermetic seal.

In general, in another aspect the invention relates to a method for removing heat from a plurality of integrated circuit devices mounted on a support including mounting a thermally conductive cover on the support over a plurality of integrated circuit devices. The cover is positioned over the integrated circuit devices in heat conductive communication with the integrated circuit devices. A plurality of depressions are formed in the thermally conductive cover such that,the depressions are in heat conductive communication with corresponding integrated circuit devices.

In general, in another aspect the invention relates to a module including a support structure. An integrated circuit device is mounted to the support structure. A thermally conductive cover, including heat dissipating fins, is attached to the support structure in heat conductive communication with the integrated circuit device.

In general, in another aspect the invention relates to an apparatus for removing heat from an integrated circuit device mounted to a support structure. The apparatus includes a thermally conductive cover mounted on a support structure over the integrated circuit device. The cover has a first surface that is adapted to be in heat conductive communication with the integrated circuit device. The cover further includes heat dissipating fins.

DETAILED DESCRIPTION OF THE PREFERRED EMBODIMENTS

Figure 1:
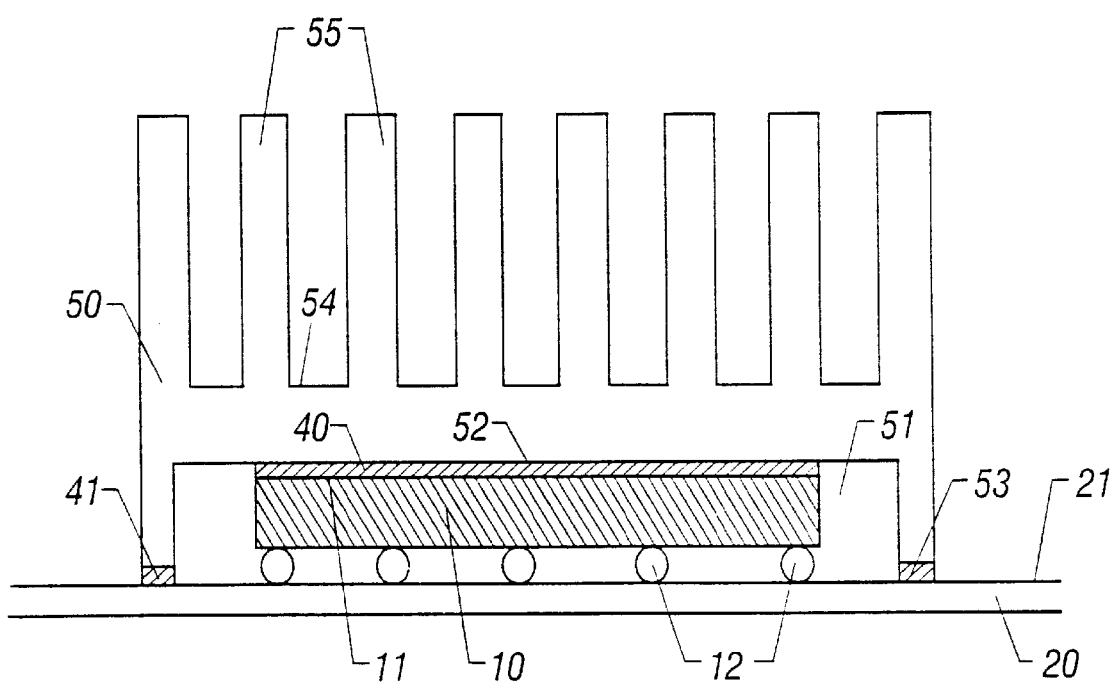
FIG. 1 is an enlarged vertical cross-sectional view of a flip-chip assembly having a thermally conductive cover with fins.

In the figures, common elements are identified with the same reference numerals. As used in this description, "support substrate" refers to any structure on which integrated circuit devices, e.g., dies, packaged devices, can be mounted. Such structures include printed circuit boards or semiconductor dies.

Referring now to FIG. 1, a flip-chip assembly has a thermally conductive cover 50 with a plurality of fins 55. The fins 55 protrude from an outer top surface 54 to provide a greater surface area from which heat generated by the die 10 inside the cover 50 can transfer quickly and dissipate. The fins can be metal formed or coated metal fins for better heat dissipation. A bare, unencapsulated integrated circuit die 10 is mounted face down directly on a support substrate 20. This support substrate could be a printed circuit board "PCB", a multi chip module ("MCM") or other ceramic glass, of semiconductor substrate. The term "flip-chip" comes from the face down, or flipped, orientation of the integrated circuit die 10 on the support substrate 20. Metal bumps 12 which could be composed, for example, of Pb, Sn, In, Ag (which may be gold plated) are formed on bonding pads (not shown) of the die 10. The bumps 12 can be made of a polymer, such as a metal-filled epoxy or a thermoplastic compound. Matching solder pads (not shown) are formed on the support substrate 20 for receiving the bumps 12. During assembly, the bumps 12 are attached to the solder pads of the support substrate 20 to electrically connect the die 10 to the support substrate 20. Standard flip-chip attach processes can be employed for this purpose.

The thermally conductive paste layer 40 is applied between the top, inner surface 52 of the cover 50 and the top surface 11 of the integrated circuit die 10. A thermoset epoxy 41 may be applied between the cover 50 and the substrate 20 to adhere the cover 50 to the substrate 20 and form a hermetic seal between the cover 50 and the substrate 20 so that the integrated circuit die 10 resides within an inner enclosed space 51 of the cover 50. This protects the integrated circuit.

A ring of thermoset epoxy 41 (or other adhesive materials) may be applied underneath a bottom wall portion 33 of the cover 50 to adhere the cover 50 to a top surface 21 of the support substrate 20. The adhesive ring layer 41 also serves to hermetically seal the die 10 in the inner enclosed space 31 of the cover 50. Alternatively, the cover 30 may be soldered to the support substrate 20 to adhere and hermetically seal the cover 50 to the support substrate 20. Other securement techniques could also be used.

The cover 50 acts as a heat sink to remove heat from the integrated circuit die 10. During operation, heat generated by the die 10 is transferred through the thermally conductive paste layer 40 and into the thermally conductive cover 50 where it is dissipated into the air. As the amount of heat dissipated through a body is directly proportional to the body's surface area, the larger surface area of the cover 50 (than that of the die 10) improves heat dissipation.

Figure 2:
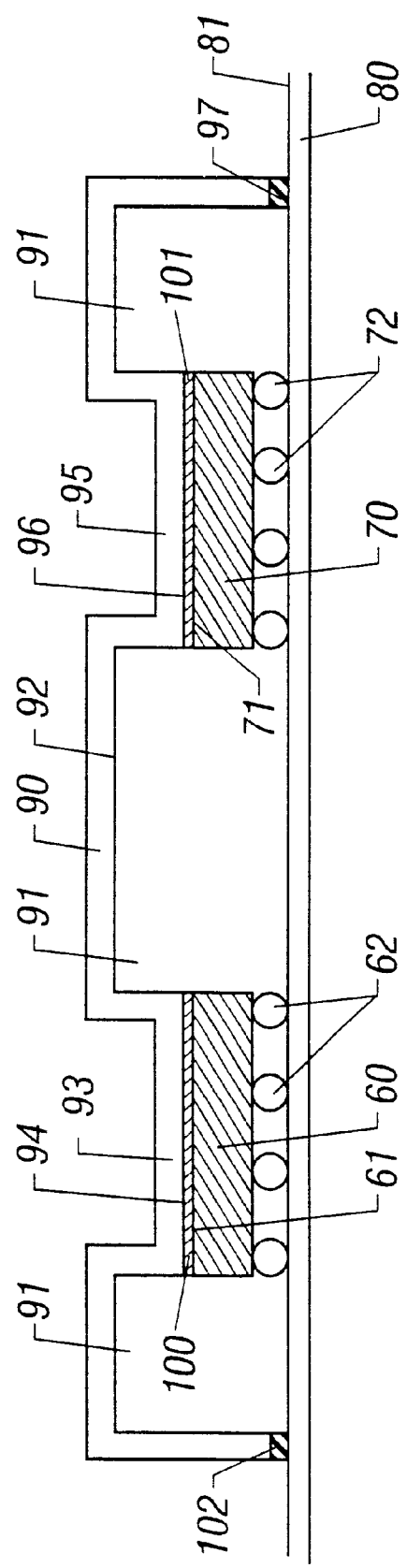
FIG. 2 is an enlarged vertical cross-sectional view of an assembly having multiple flip-chips enclosed by a thermally conductive cover.

Referring now to FIG. 2, an assembly having multiple flip-chips enclosed by a thermally conductive cover cap is shown. Multiple bare, unencapsulated dies 60, 70 are mounted face down directly on a support substrate 80. The multiple dies 60, 70 may have the same or different thicknesses. Bumps 62 electrically connect the die 60 to the support substrate 80, and bumps 72 electrically connect the die 70 to the support substrate 80. A thermally conductive cover 90 mounted to the support substrate 80 covers and encloses the multiple dies 60, 70 within an inner enclosed space 91 defined by the cover 90 and the support substrate 80. The cover 90 provides multiple offset portions 93, 95 which may be stamped from a single piece of metal. The offset portions 93, 95 protrude into the inner enclosed space 91 of the cover 90 to reach the back surfaces 61, 71 of the dies 60, 70. The top, inner-surface 94 of the offset portion 93 makes thermal contact with a back surface 61 of the die 60 through a thermally conductive paste layer 100, and the top, inner surface 96 of the offset portion 95 makes thermal contact with a back surface 71 of the die 70 through a thermally conductive paste layer 101. Depending upon the thicknesses of the dies 60, 70, the offset portions 93, 95 may be of same or different depths.

The cover 90 may be attached to a top surface 81 of the support substrate 80 by applying an adhesive ring 102 or a solder ring (not shown) underneath the bottom wall 97 of the cover 90. The cover 90 hermetically seals the dies 60, 70 which are mounted to the support substrate 80.

Alternatively, if dies having substantially similar thicknesses are mounted on the support substrate 80 such that their back surfaces reach substantially the same height, a cover without offset portions can be used to enclose and seal the dies. Any small variation in height can be compensated for by varying the thicknesses of the thermally conductive paste layer.

An added advantage of the cover 90 is that it provides a larger surface area to dissipate heat.

Figure 3:
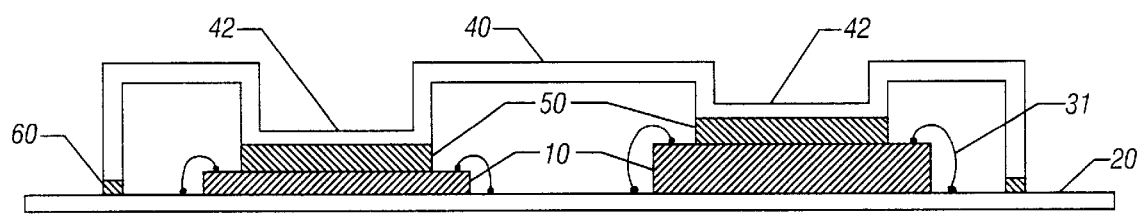
FIG. 3 is an enlarged vertical cross-sectional view of an assembly having multiple chips-on-board enclosed by a thermally conductive cover.

Referring now to FIG. 3, a plurality of bare, unencapsulated chip-on-board ("COB") integrated circuit devices 10 are mounted face up directly on a substrate 20. The integrated circuit devices 10 may be of same or different thicknesses. Bond wires 31, which may be made of gold, are bonded to bonding pads on the integrated circuit devices 10 and substrate 20, and electrically connect integrated circuit devices 10 to the substrate 20. Bonding may be accomplished by, for example, thermosonic bonding. A thermally conductive cover 40 is attached to substrate 20 and covers the plurality of integrated circuit devices 10. Better heat dissipation may be achieved because the cover acts as both a heat sink and a cover.

The cover 40 has a plurality of offset regions 42 formed therein, which may be stamped from a single piece of metal. A plurality of offset regions 42 may be of same or different depths, and enable cover 40 to be in thermal contact with each one of plurality of integrated circuit devices 10.

A thermally conductive paste 50 may be applied between a plurality of offset regions 42 and a plurality of integrated circuit devices 10. The paste 50 contacts both the plurality of offset regions 42 and the plurality of integrated circuit devices 10. A thermoset epoxy 60 may be applied between cover 40 and substrate 20 to adhere the cover 40 to substrate 20 and form a hermetic seal between cover 40 and substrate 20. Alternatively, cover 40 may be soldered to substrate 20 to adhere and hermetically seal cover 40 to substrate 20.

It is to be understood that the embodiments described above are merely illustrative of some of the many specific embodiments of the present invention. Other arrangements can be devised by one of ordinary skill in art at the time the invention was made without departing from the scope of the invention.

What is claimed is:

1. An apparatus for removing heat from a plurality of integrated circuit devices mounted to a support structure, said apparatus comprising:

a thermally conductive cover mounted on the support structure over said plurality of integrated circuit devices, said cover including an upper and lower surface, each having a corrugated shape including a plurality of depressions formed in said cover, each of said depressions being rectangular and having a bottom surface, a top surface and four substantially transverse side walls connecting said bottom surface to said top surface; and said cover adapted to hermetically seal to said support structure to enclose said integrated circuit devices in a sealed enclosure with said bottom surfaces in heat conductive communication with said integrated circuit devices.

2. The apparatus of claim 1 wherein said depressions are of different sizes.

3. A method for removing heat from a plurality of integrated circuit devices mounted on a support, comprising:

mounting a plurality of integrated circuit devices on a support;

mounting a thermally conductive cover on the support over said plurality of integrated circuit devices, said cover having an upper and a lower surface said upper surface including a series of upward protrusions between the integrated circuit devices, said protrusions extending away from said devices and a plurality of cavities between said protrusions over said integrated circuit devices, said lower surface including a plurality of depressions, each of said depressions being rectangular and having a bottom surface and four substantially transverse side walls connecting said bottom surface to the rest of said cover, said depressions in said lower surface being opposed to said cavities in said upper surface;

positioning said bottom surfaces in heat conductive communication with said devices; and sealing said cover to said support so as to hermetically enclose said devices between said cover and said support.

4. The method of claim 3, wherein the integrated circuit devices include a bare die mounted on the support in a flip-chip configuration.

5. The method of claim 3, wherein the integrated circuit devices include a bare die wirebonded to the support.

6. The method of claim 3, wherein the integrated circuit devices include a packaged die.

* * * * *